US012801885B2

(12) United States Patent
Pohl et al.

(10) Patent No.: US 12,801,885 B2
(45) Date of Patent: Nov. 17, 2026

(54) CHIP ASSEMBLY, METHOD FOR FORMING A CHIP ASSEMBLY, AND METHOD FOR USING A CHIP ARRANGEMENT

(71) Applicant: Infineon Technologies AG, Neubiberg (DE)

(72) Inventors: Jens Pohl, Bernhardswald (DE); Michael Huber, Nittendorf/Undorf (DE); Frank Püschner, Kelheim (DE); Thomas Spöttl, Mintraching (DE)

(73) Assignee: Infineon Technologies AG, Neubiberg (DE)

( * ) Notice: Subject to any disclaimer, the term of this patent is extended or adjusted under 35 U.S.C. 154(b) by 422 days.

(21) Appl. No.: 18/453,055

(22) Filed: Aug. 21, 2023

(65) Prior Publication Data

US 2024/0078406 A1 Mar. 7, 2024

(30) Foreign Application Priority Data

Sep. 1, 2022 (DE) ......................... 102022122187.3

(51) Int. Cl.
*G06K 19/077* (2006.01)
*H10W 70/60* (2026.01)

(52) U.S. Cl.
CPC ... *G06K 19/0775* (2013.01); *G06K 19/07743* (2013.01); *G06K 19/07747* (2013.01); *H10W 70/699* (2026.01)

(58) Field of Classification Search
CPC .......... G06K 19/0775; G06K 19/07747; H01L 23/49855
USPC .......................................................... 235/492
See application file for complete search history.

(56) References Cited

U.S. PATENT DOCUMENTS

2015/0136858 A1* 5/2015 Finn ....................... B23K 26/40 235/492
2022/0051250 A1* 2/2022 Vargas ..................... H03K 3/03

FOREIGN PATENT DOCUMENTS

DE 102015015201 A1 5/2017

OTHER PUBLICATIONS

Feb. 28, 2023 (DE) Office Action—App. 102022122187.3.
Infineon Technologies AG, "NFC Bezahllösungen", www.Infineon.com, 8 pgs., May 22, 2022.

* cited by examiner

*Primary Examiner* — Toan C Ly
(74) *Attorney, Agent, or Firm* — Banner & Witcoff, Ltd.

(57) ABSTRACT

A chip arrangement including a chip module which includes a chip, a contact-based interface in accordance with ISO 7816 which is electrically conductively connected to the chip, and an antenna structure which is electrically conductively connected to the chip and provides a contactless interface, and a carrier which comprises a chip module receptacle and a booster antenna structure which, when the chip module is arranged in the chip module receptacle of the carrier, inductively couples to the antenna structure of the chip module, wherein the chip module is arranged releasably in the chip module receptacle.

16 Claims, 8 Drawing Sheets

CHIP ASSEMBLY, METHOD FOR FORMING A CHIP ASSEMBLY, AND METHOD FOR USING A CHIP ARRANGEMENT

TECHNICAL FIELD

The invention relates to a chip arrangement, a method for forming a chip arrangement and a method for using a chip arrangement.

BACKGROUND

At present, despite similar functionality, in particular as regards a chip-based use by means of a contactless (CL) interface, the form factors smart card and wearable are provided as completely separate units.

Correspondingly, a user can presently use, for example, a dual interface smart card which can contain, for example, a security chip by means of its contact-based (CB) interface (which can be formed in correspondence to ISO 7816) or by means of its contactless interface.

In addition, the user can use a wearable, i.e. a portable device which is designed for contactless communication. The wearable can be provided, for example, in the form of a smart phone, a smart ring, a smart watch, a smart bracelet, a key fob or the like and can likewise contain a security chip.

SUMMARY

There is a need for a chip arrangement which makes it possible to operate a plurality of form factors.

In various exemplary embodiments, a chip arrangement is provided in which a chip module which comprises a contact-based interface and a contactless interface is arranged in a chip module receptacle of a carrier in such a way that it can be removed from the chip module receptacle and reinserted into the chip module receptacle repeatedly without being destroyed, wherein the chip module, when arranged in the chip module receptacle, couples to a booster antenna integrated in the carrier.

The carrier can be configured, for example, as a smart card in ID1 format, with the result that the carrier with the chip module inserted in the chip module receptacle can be used as a regular dual interface smart card.

If the chip module is removed from the chip module receptacle, it can be inserted, for example, into a wearable chip module receptacle and used there for a contactless use.

A range can be extended in the case of the arrangement in the carrier by means of the booster antenna in comparison with a range in the case of an arrangement in the wearable. In this case, standard specifications as regards range, for example a minimum range (see, for example, EMVCo), can be met.

A mechanical connection between the chip module and the carrier can be configured in such a way that a plurality of insertion and removal cycles is made possible.

BRIEF DESCRIPTION OF THE DRAWINGS

Exemplary embodiments of the invention are illustrated in the figures and are explained in more detail below.

In the drawings

DETAILED DESCRIPTION

In the following detailed description, reference is made to the appended drawings which form part thereof and in which specific embodiments are shown for illustrative purposes in which the invention can be performed. In this regard, directional terminology such as, for example, "top", "bottom", "at the front", "at the rear", "front", "rear", etc. are used with reference to the orientation of the described figure(s). Since components of embodiments can be positioned in a number of different orientations, the directional terminology is used for illustrative purposes and is in no way restrictive. It goes without saying that other embodiments can be used, and structural or logical changes can be performed without departing from the scope of protection of the present invention. It goes without saying that the features of the various exemplary embodiments described herein can be combined with one another if not specifically specified otherwise. The following detailed description therefore cannot be interpreted in the restrictive sense, and the scope of protection of the present invention is defined by the appended claims.

Within the scope of this description, the terms "connected" and "coupled" are used for describing both a direct or indirect connection and a direct or indirect coupling. In the figures, identical or similar elements are provided with identical reference signs insofar as this is expedient.

Figure 1:
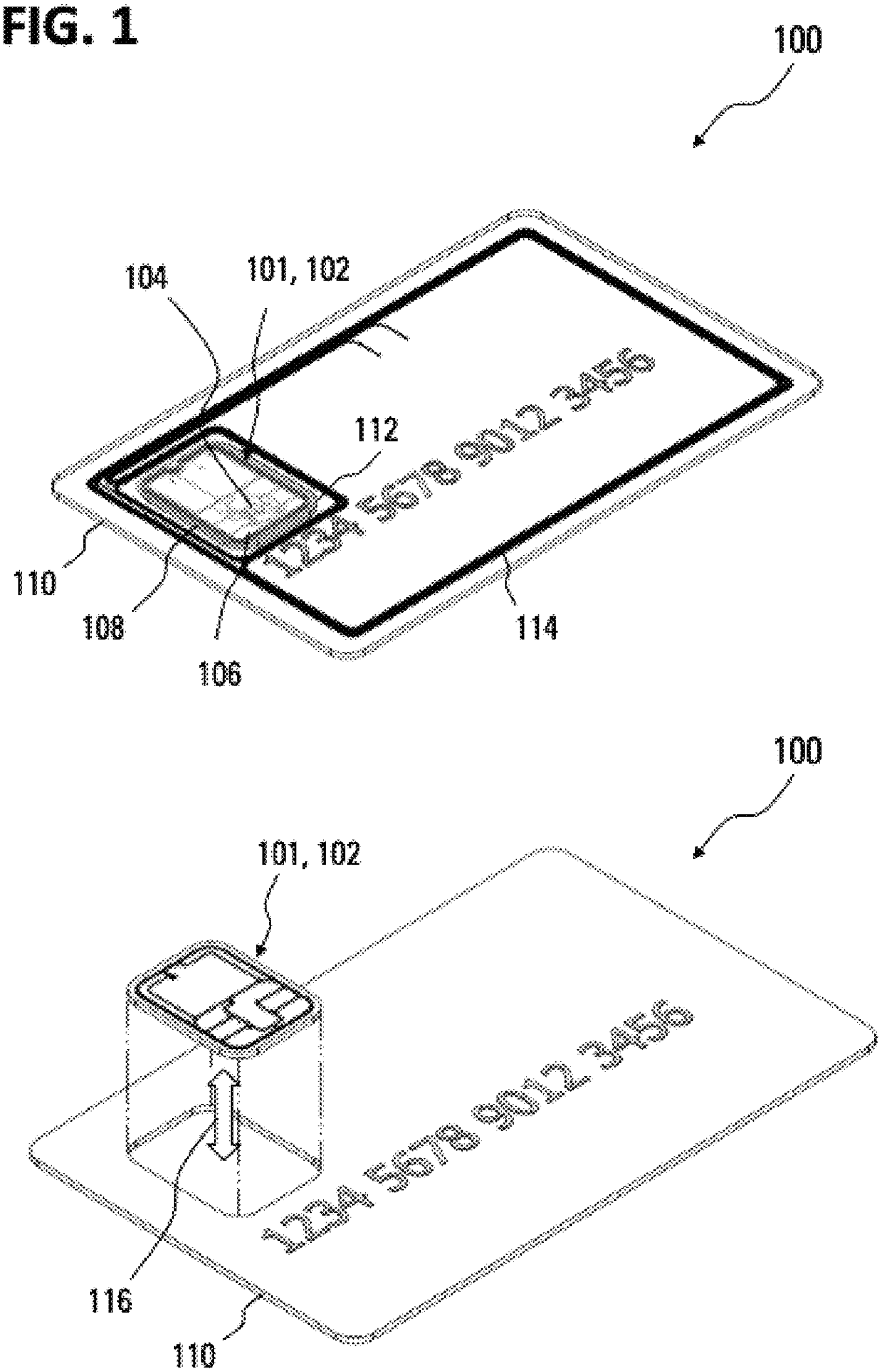
FIG. 1 shows two schematic illustrations of a chip arrangement in accordance with various exemplary embodiments.

FIG. 1 shows two schematic illustrations of a chip arrangement 100 in accordance with various exemplary embodiments, to be precise a perspective view at the top, in which parts of the chip arrangement are illustrated as being transparent in order to show different otherwise hidden structures, and a perspective partial exploded view at the bottom, wherein the partial exploded illustration is also expedient for illustrating a use of the chip arrangement 100.

Figure 2A:
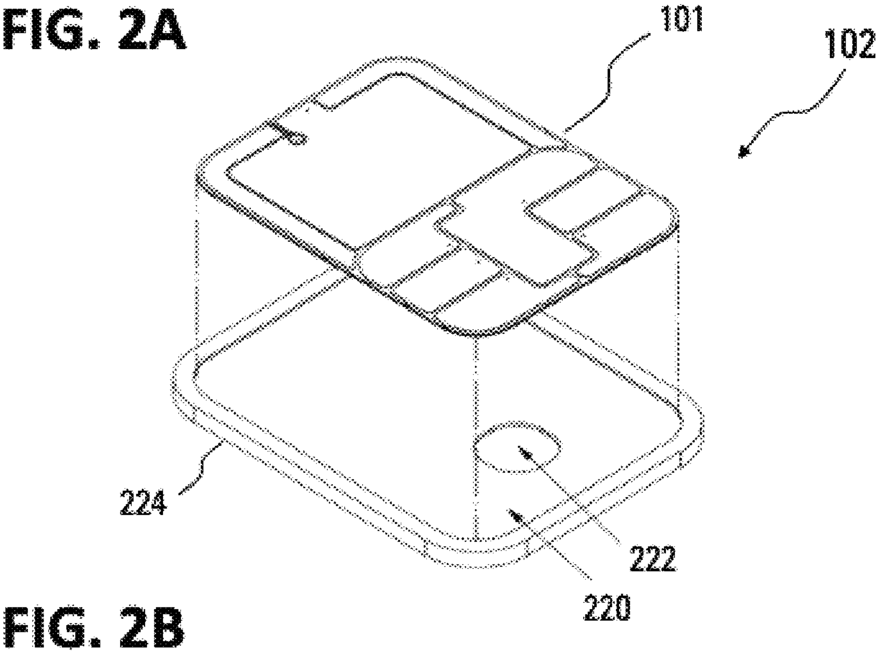
FIGS. 2A and 2B show an illustration of a chip module of a chip arrangement in accordance with various exemplary embodiments.
Figure 2B:
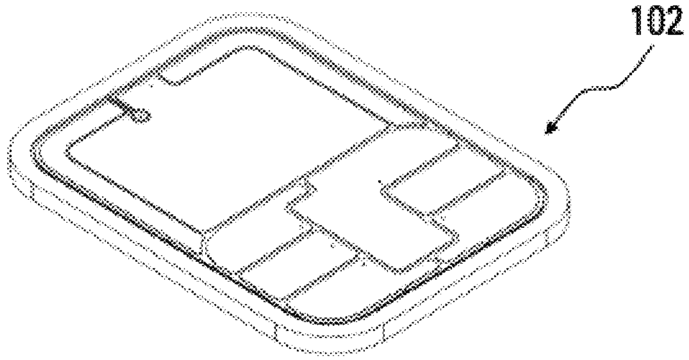

FIGS. 2A and 2B show an illustration of a chip module 102 of a chip arrangement 100 in accordance with various exemplary embodiments. In this case, FIG. 2A shows a partial exploded view, and FIG. 2B shows the complete chip module 102.

Figure 2C:
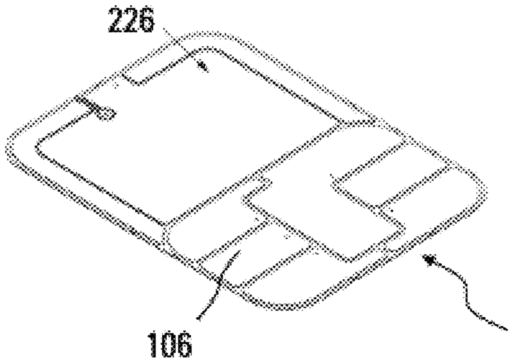
FIGS. 2C and 2D show perspective views of an upper side and a lower side of a chip device which is part of the chip module from FIGS. 2A and 2B.
Figure 2D:
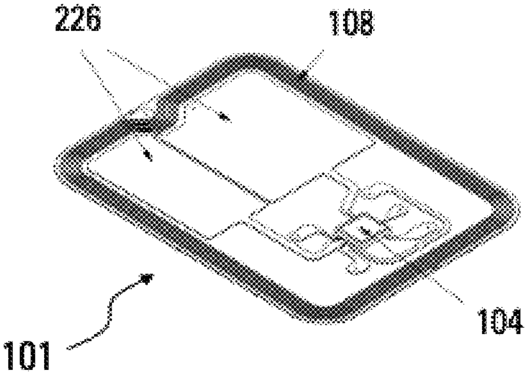

FIGS. 2C and 2D show perspective views of an upper side (in FIG. 2C) and a lower side (in FIG. 2D) of a chip device 101 which is part of the chip module 102 from FIGS. 2A and 2B.

The chip arrangement 100 comprises a chip module 102 which comprises a chip 104, a contact-based interface 106 in accordance with ISO 7816 which is electrically conductively connected to the chip 104, and an antenna structure 106 which is electrically conductively connected to the chip 104 and provides a contactless interface.

The chip module 102 can therefore be in the form of a so-called Coil-on-Module (CoM) dual interface (DIF) module. FIG. 2C illustrates, by way of example, structures which are provided for the contact-based interface 106 on the front side of the chip device 101 which is part of the chip module 102 (in particular the contact faces arranged in standardized fashion), and FIG. 2D shows the antenna 108 arranged on the rear side of the chip device 101 and having capacitor plates 226 which act as serial and parallel capacitors for tuning the antenna 108, and the chip 104. The chip device 101 can substantially be formed, as regards the contactless interface, as described in DE 10 2018 105 383 B4.

The chip 104 can comprise, for example, a security chip (also referred to as secure element (SE)) which is typically used, for example, for banking applications, identification functions, access controls (for example generally for authentications) etc.

The chip arrangement 100 also comprises a carrier 110, which comprises a chip module antenna 112 and a booster antenna structure 114.

The booster antenna structure 114 can be designed in such a way that, when the chip module 102 is arranged in the chip module receptacle 112 of the carrier 110, said booster antenna structure 114 inductively couples to the antenna structure 108 of the chip module 102, for example in a coupling region in which the booster antenna structure 114 is formed so as to surround the chip module receptacle 112.

The chip module 102 can also comprise a chip module carrier 224. The chip device 101 can be fixedly connected to the chip module carrier 224, for example by means of a hot adhesive or another adhesive agent on or in the chip module carrier 224.

In FIG. 2A, the chip module carrier 224 comprises a first opening for receiving the chip device 101 and a second, deeper opening for receiving the chip 104.

The carrier 110 can be formed, for example, as a smart card body, for example in the standardized ID1 format.

The carrier 110 can have any desired materials conventionally used for carriers of chip modules, for example polymers. By way of example, the carrier can have a carrier body on or in which the booster antenna structure 114 can be arranged (for example embedded) and in which the chip module receptacle 112 can be formed.

The carrier body can comprise, for example, a laminated layer stack.

The chip module 102 can be arranged releasably in the chip module receptacle 112.

In this case, "releasable" should be understood to mean that the chip module 102 can be removed from the chip module receptacle 112 and reinserted into it repeatedly. In this case, after the reinsertion, the functionality which existed before the removal is reproduced.

Figure 3:
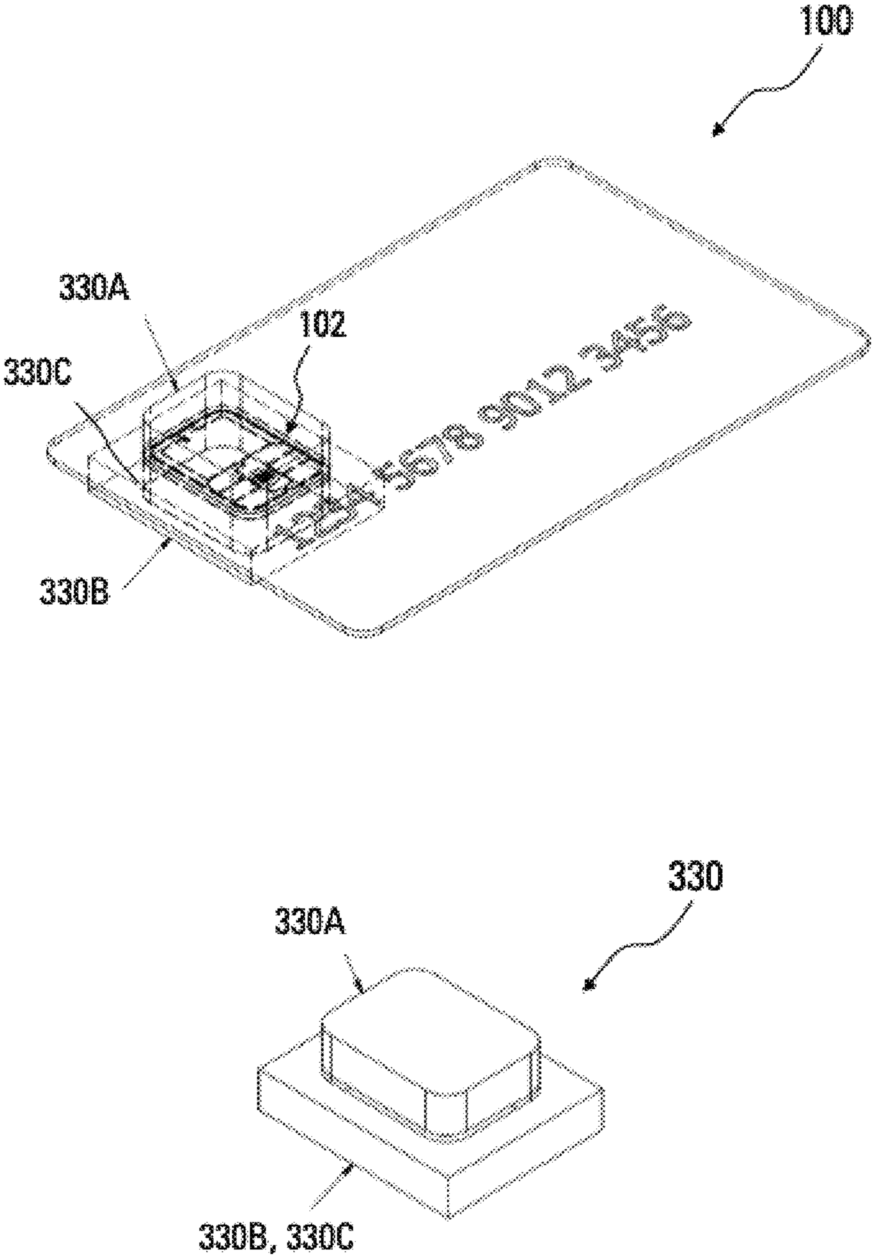
FIG. 3 shows the chip arrangement in accordance with various exemplary embodiments from FIG. 1 having a punching tool which is used in accordance with various exemplary embodiments for forming the chip arrangement.
Figure 4:
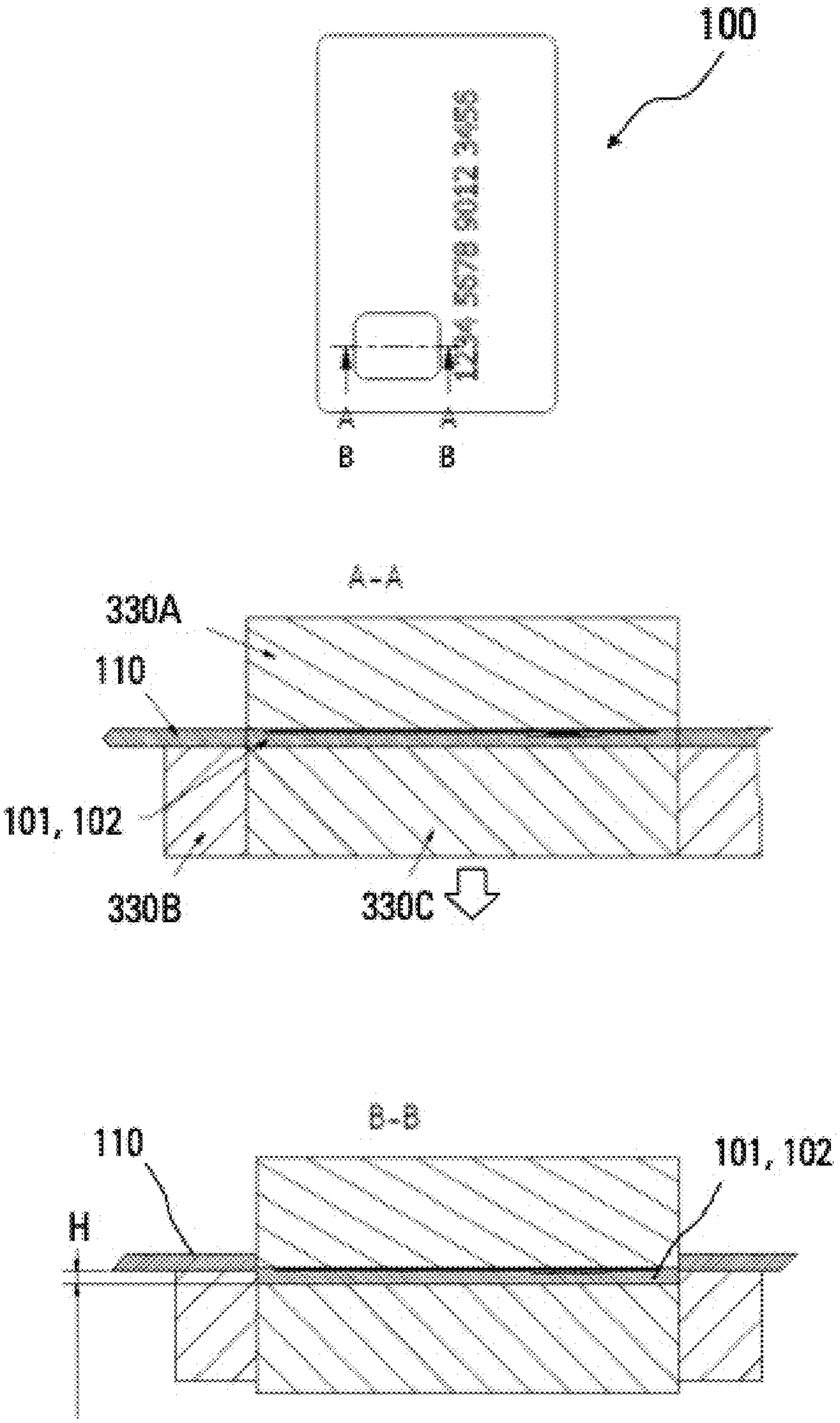
FIG. 4 shows an illustration of a method for forming a chip arrangement in accordance with various exemplary embodiments.

FIG. 3 and FIG. 4 illustrate a method for forming the chip arrangement 100 in accordance with various exemplary embodiments, wherein, in FIG. 3, the chip arrangement 100 and a punching tool 330 are shown as schematic perspective views, and FIG. 4 illustrates a process during formation of the chip arrangement 100 in cross-sectional views.

The method illustrated in FIG. 3 and FIG. 4 makes it possible to produce the releasable arrangement of the chip module 102 in the carrier 110 in an efficient and cost-effective manner.

In this case, first, as is conventional in the production of smart cards, the chip device 101 is fitted in a cavity (i.e. an opening which has been provided at least partially with a base), for example fitted by means of hot adhesive as described above. This procedure conventionally takes place on an ID1 card level. For this purpose, the chip device 101 is laminated together in a standard smart card carrier strip initially on the rear side with a hot adhesive (hotmelt) tape. Thereafter, the chip device 101 is punched out of the carrier tape and inserted into the cavity 220 in the carrier 110 in a so-called implantation process.

Once the chip device 101 has been fitted in the cavity, the chip module can be produced (in the sense of: detached from a larger composite, for example the carrier strip), in this case at the same time the chip module receptacle 112 can be formed and then the chip module 102 can be arranged directly back in the chip module receptacle 112.

For this purpose, the punching tool 330 illustrated in FIG. 3 can be used.

The punching tool 330 can have a punching plunger 330A, a punching die 330C and an ejector 330C.

The carrier 110 can be arranged in relation to the punching tool 330 in such a way that the chip device 101 is located between the punching plunger 330A and the ejector 330C, and an inner edge of the punching die 330B surrounds the chip device 101 and therefore defines an outer circumference of the chip module 102 to be formed. A clamping device (downholder) which can also be provided for clamping the parts which are intended to maintain a fixed position relative to one another is not illustrated in the figures.

The initial position prior to the punching operation is illustrated in section A-A in FIG. 4. In the initial position, the punching die 330B and the ejector 330C can be coplanar or substantially coplanar and can be in contact with the carrier 110. The punching plunger 330A is in contact with the carrier 110 opposite the ejector 330C.

Thereupon, the punching plunger 330A and the ejector 330C are moved together in a direction (in this case downwards; see section B-B) so that the punching plunger enters the punching die 330B, at least by a height H. In this case, the height H is dimensioned such that the chip module 102 which is produced is completely detached from the carrier 110. Depending on the material, it may be necessary for the height H to correspond to a thickness of the carrier 110 or, for example in the case of a relatively brittle carrier material, to a smaller height H. During the movement, the carrier 110 is severed, for example sheared until severing, at an inner edge of the punching die 330B or an outer edge of the punching plunger 330A.

In order to reinsert the chip module 102 into the carrier 110 (or into the chip module receptacle 112 formed by the punching operation), the ejector 330C and the punching plunger 330A are moved together in the opposite direction (out of the punching die 330B, in this case: upwards) until the ejector 330C is again coplanar with an upper side of the punching die 330B or until the upper side of the chip module 102 is coplanar with an upper side of the carrier 110.

Then, the punching plunger 330A moves further upwards (and the clamping device is possibly released) in order to release the carrier 110 and the chip module 102.

The chip module 102 has been fitted in a form-fitting manner into the chip module receptacle 112 of the carrier 110, is held there reliably by means of the generated press fit and is removable and reinsertable by hand (for example by means of being pressed in on a flat surface) multiple times without being destroyed.

Since the chip module carrier 224 is formed from the carrier 110, their materials are identical. Insofar as (see FIG. 5B) the carrier 110 is then supplemented further, the chip module carrier 224 and the carrier 110 comprise at least partially the same materials.

Even if the described method is very efficient and expedient, it is possible for other or modified assembly arrangements and methods to be used in other exemplary embodiments for releasably arranging the chip module in the chip module receptacle.

Figure 5A:
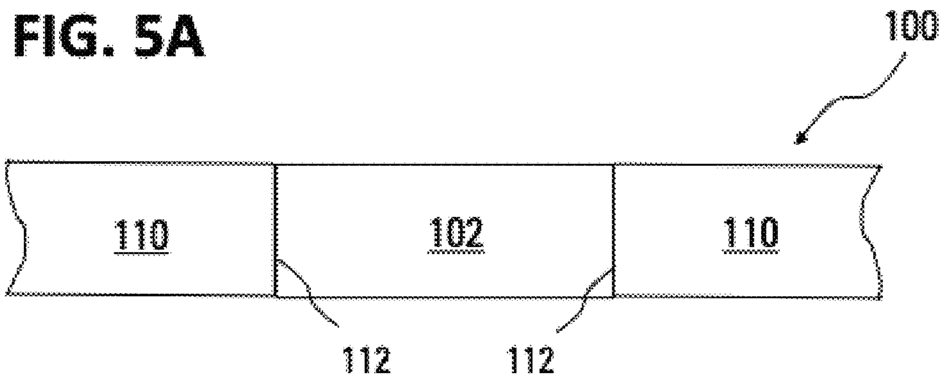
FIGS. 5A to 5C each show a schematic cross-sectional detail view of a chip arrangement in accordance with various exemplary embodiments.

The through-opening produced by means of the method explained in relation to FIG. 4 as chip module receptacle 112 with the press fit of the chip module 102 is illustrated in FIG. 5A.

Figure 5B:
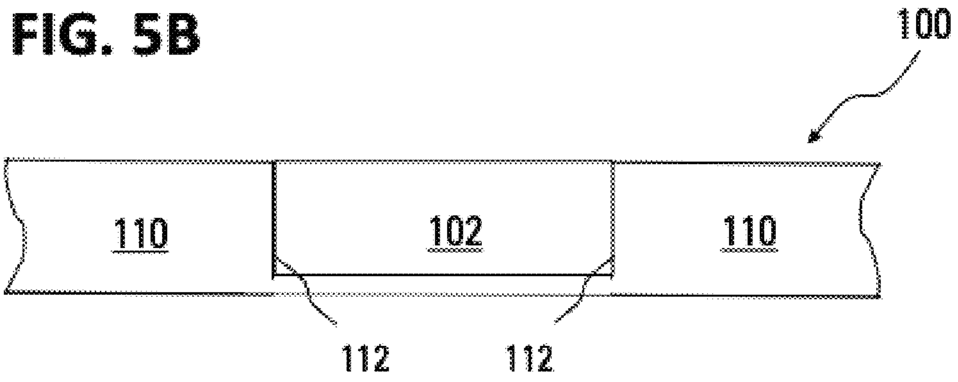

In FIG. 5B, the chip module receptacle 112 is embodied as a cavity, i.e. it is not a through-opening but is provided (at least partially) with a base on which the chip module 102 arranged in the chip module receptacle 112 rests at least partially.

The arrangement in accordance with FIG. 5B can be produced in various exemplary embodiments, for example, by means of the punching operation being performed as described in relation to FIG. 4 and then an additional layer being applied (for example laminated on) over a rear side of the carrier 110 and the chip module receptacle 112 (wherein, depending on the temperature sensitivity of the chip module 102 and/or adhesion force of the laminate bond produced, the chip module 102 can be removed, possibly during the lamination process).

An additional complexity for the formation of the cavity base can be considered, for example, when more reliable protection against the chip module falling out is intended to be provided.

Figure 5C:
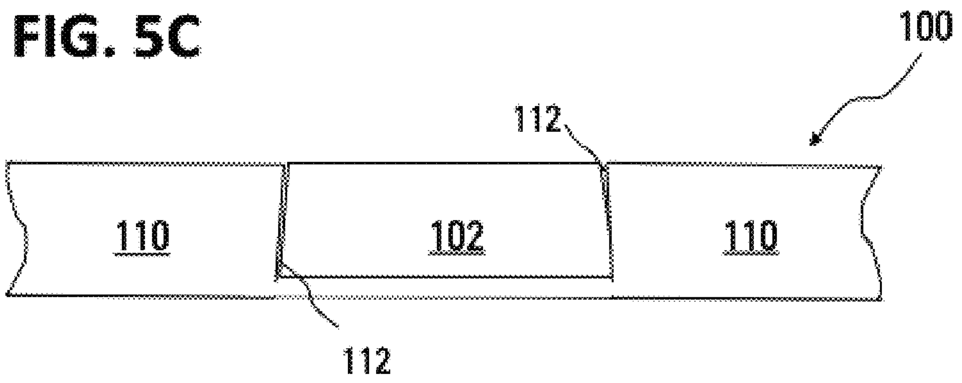

FIG. 5C illustrates an exemplary embodiment in which the chip module 102 and the carrier 110 have been formed separately and then joined together.

The chip module receptacle 112 can be in the form of a cavity in which at least two mutually opposite side walls are inclined slightly in such a way that the cavity is larger at the base than at its opening.

The chip module 102 can be provided with at least two side walls which are likewise slightly inclined so that the associated upper edges of the chip module 102 (on the side with the contact-based interface 102) are closer to one another than the corresponding associated lower edges.

By means of the carrier 110 being bent slightly, the chip module receptacle 112 can be opened in such a way that the chip module 102 can be inserted into the chip module receptacle 112. In the state illustrated in FIG. 5C, the carrier 110 is planar again and the chip module 102 is secured against falling out by means of the substantially parallel side walls of chip module 102 and chip module receptacle 112.

In the case of a V-shaped configuration of the side walls, in various exemplary embodiments a carrier 110 with through-opening can be combined with a separately formed chip module 102.

Figure 6:
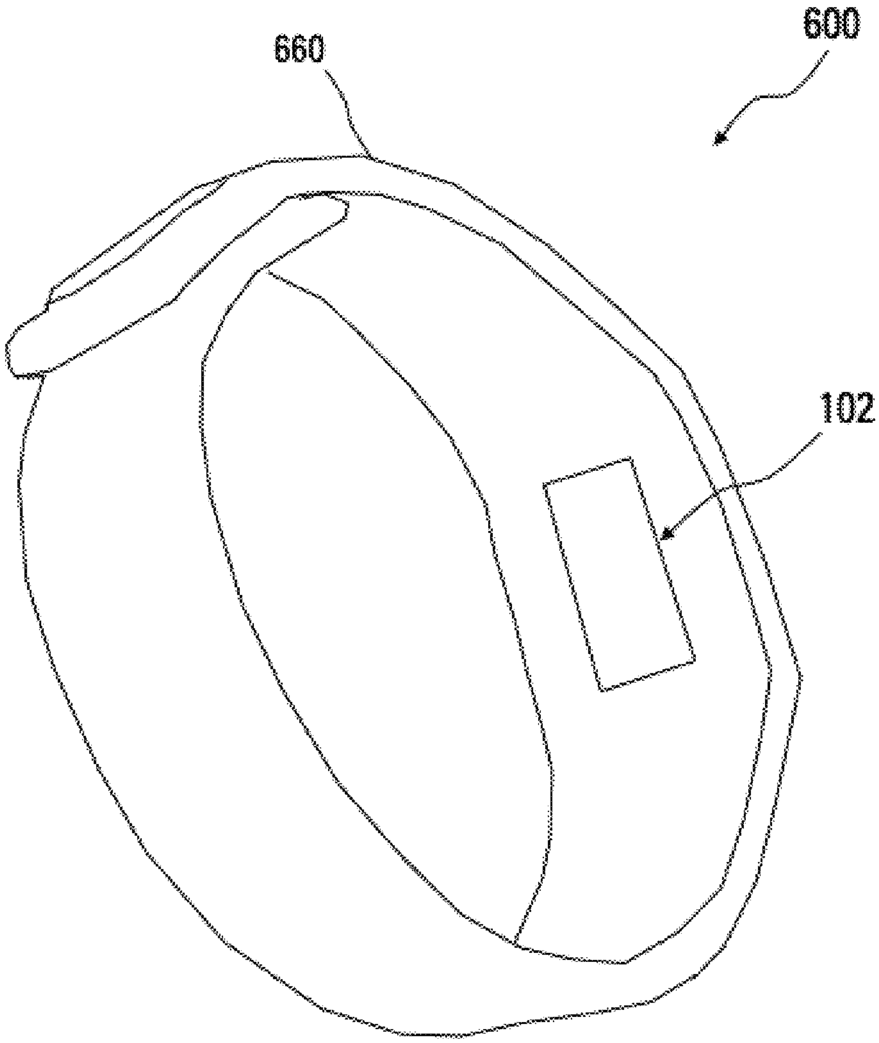
FIG. 6 shows a schematic illustration of a wearable in which a chip module in accordance with FIGS. 2A and 2B has been inserted.

FIG. 6 shows a schematic illustration of a wearable 600 in which a chip module 102 in accordance with FIGS. 2A and 2B is inserted.

By way of example, an armband is illustrated which comprises an opening or pocket for fastening the chip module 102.

Other types of wearables, for example smart phones, smart rings, key fobs, etc., can have in each case receptacles formed corresponding to their form factor.

With the chip module 102, the wearable is designed for applications which require a contactless interface as is provided by the chip module 102.

Figure 7:
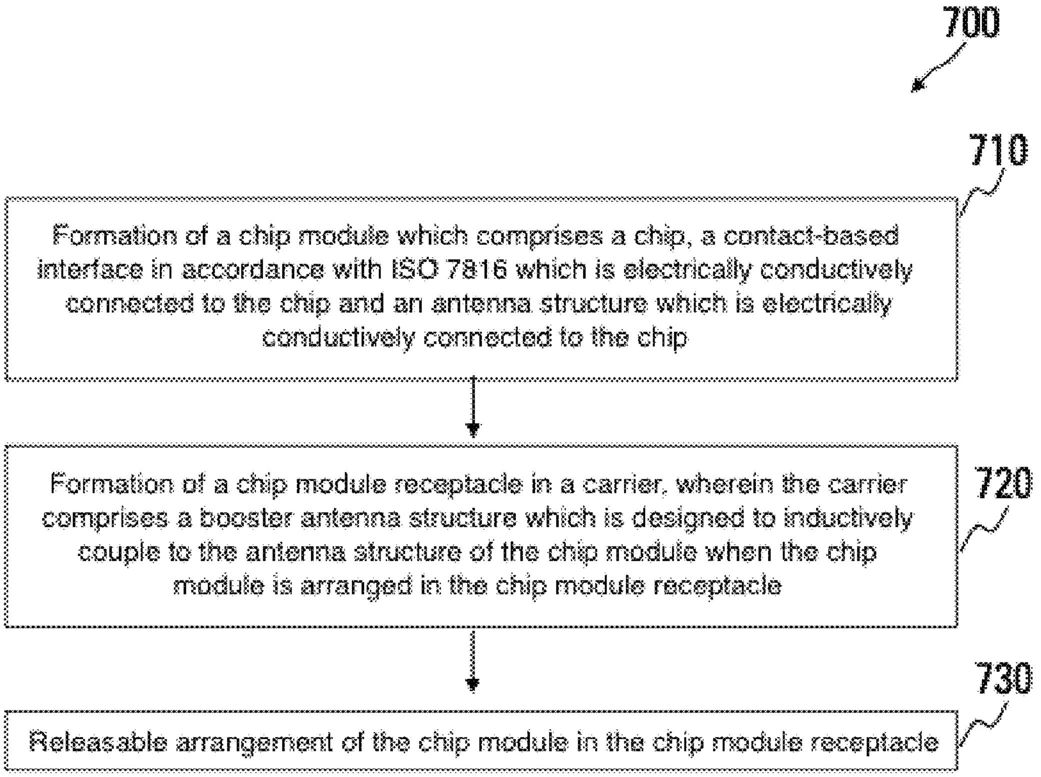
FIG. 7 shows a flow chart of a method for forming a chip arrangement in accordance with various exemplary embodiments.

FIG. 7 shows a flowchart 700 of a method for forming a chip arrangement in accordance with various exemplary embodiments.

The method comprises a formation of a chip module which comprises a chip, a contact-based interface in accordance with ISO 7816 which is electrically conductively connected to the chip, and an antenna structure which is electrically conductively connected to the chip (at 710), a formation of a chip module receptacle in a carrier, wherein the carrier comprises a booster antenna structure which is designed to inductively couple to the antenna structure of the chip module when the chip module is arranged in the chip module receptacle (at 720), and a releasable (for example repeatedly releasable and arrangeable) arrangement of the chip module in the chip module receptacle (at 730).

Figure 8:
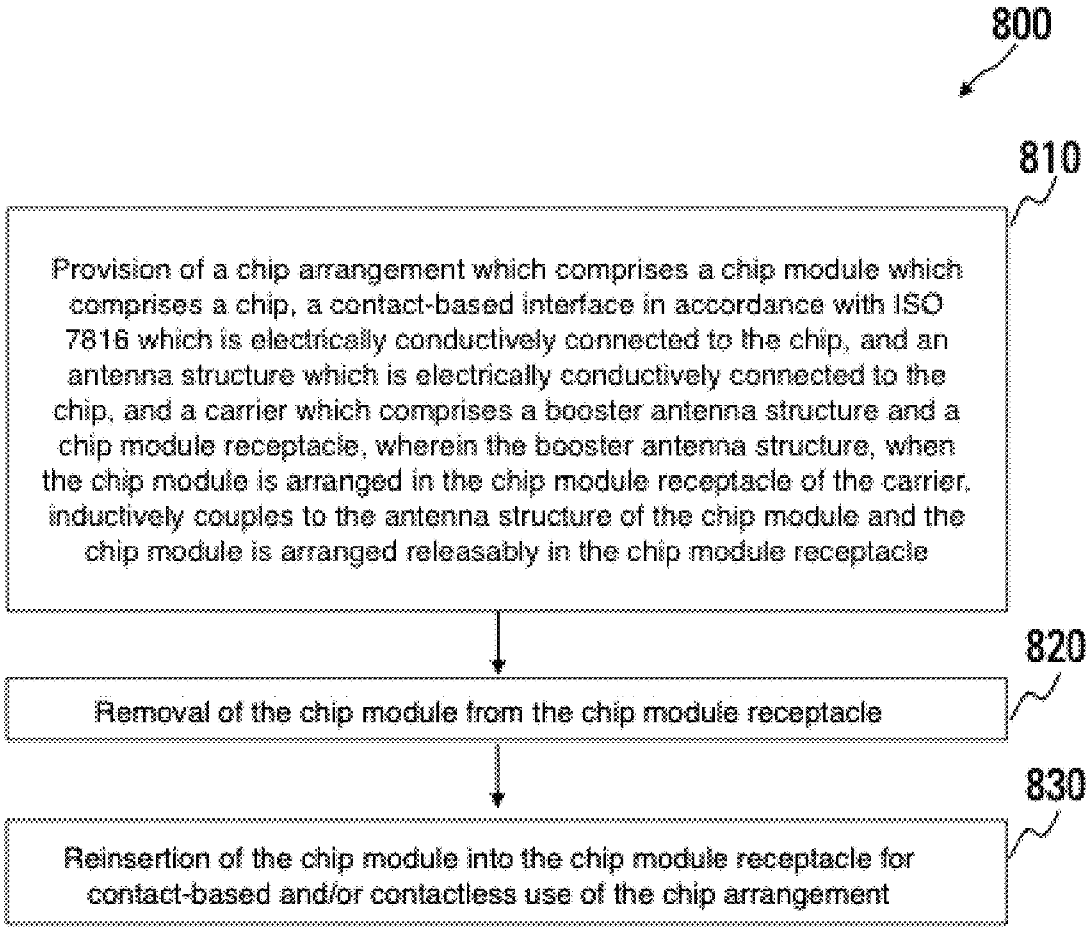
FIG. 8 shows a flow chart of a method for using a chip arrangement in accordance with various exemplary embodiments.

FIG. 8 shows a flowchart of a method for using a chip arrangement in accordance with various exemplary embodiments.

The method comprises a provision of a chip arrangement which comprises a chip module which comprises a chip, a contact-based interface in accordance with ISO 7816 which is electrically conductively connected to the chip, and an antenna structure which is electrically conductively connected to the chip, and a carrier which comprises a booster antenna structure and a chip module receptacle, wherein the booster antenna structure, when the chip module is arranged in the chip module receptacle of the carrier, inductively couples to the antenna structure of the chip module, and the chip module is arranged releasably in the chip module receptacle (at 810), a removal of the chip module from the chip module receptacle (at 820), and a reinsertion of the chip module into the chip module receptacle for contact-based and/or contactless use of the chip arrangement (at 830).

In various exemplary embodiments, the chip module can also be inserted, after the removal, into a wearable for use of the wearable by means of the contactless interface of the chip module 102.

By way of summary, some exemplary embodiments are specified below.

Exemplary embodiment 1 is a chip arrangement. The chip arrangement comprises a chip module which comprises a chip, a contact-based interface in accordance with ISO 7816 which is electrically conductively connected to the chip, and an antenna structure which is electrically conductively connected to the chip and provides a contactless interface, and a carrier, which comprises a chip module receptacle and a booster antenna structure which, when the chip module is arranged in the chip module receptacle of the carrier, inductively couples to the antenna structure of the chip module, wherein the chip module is arranged releasably in the chip module receptacle.

Exemplary embodiment 2 is a chip arrangement in accordance with exemplary embodiment 1, wherein the chip module also comprises a chip module carrier.

Exemplary embodiment 3 is a chip arrangement in accordance with exemplary embodiment 1 or 2, wherein the carrier comprises a carrier body, in which the chip module receptacle is formed as an opening and on or in which the booster antenna structure is formed.

Exemplary embodiment 4 is a chip arrangement in accordance with exemplary embodiments 2 and 3, wherein the carrier body and the chip module carrier comprise the same material or (for example in a case where a plurality of materials, for example in the form of a layer stack, is provided) the same materials.

Exemplary embodiment 4a is a chip arrangement in accordance with exemplary embodiments 2 and 3, wherein the carrier body and the chip module carrier comprise different materials or differently arranged materials (for example layer stacks consisting of the same materials but with a different layer sequence).

Exemplary embodiment 5 is a chip arrangement in accordance with exemplary embodiment 4, wherein the chip module carrier is formed by means of the carrier body being separated off.

Exemplary embodiment 6 is a chip arrangement in accordance with one of exemplary embodiments 1 to 5, wherein the carrier has a smart card ID1 format.

Exemplary embodiment 7 is a chip arrangement in accordance with one of exemplary embodiments 1 to 6, wherein the chip module receptacle is a through-opening.

Exemplary embodiment 8 is a chip arrangement in accordance with one of exemplary embodiments 1 to 7, wherein the chip module receptacle is a cavity.

Exemplary embodiment 9 is a chip arrangement in accordance with one of exemplary embodiments 1 to 8, wherein the chip module is connected in a form-fitting manner to the chip module receptacle, for example is arranged in a form-fitting manner in the chip module receptacle.

Exemplary embodiment 10 is a method for forming a chip arrangement. The method comprises a formation of a chip module which comprises a chip, a contact-based interface in accordance with ISO 7816 which is electrically conductively connected to the chip, and an antenna structure which is electrically conductively connected to the chip, and a formation of a chip module receptacle in a carrier, wherein the carrier comprises a booster antenna structure which is designed to inductively couple to the antenna structure of the chip module when the chip module is arranged in the chip module receptacle, and a releasable (for example repeatedly releasable and arrangeable) arrangement of the chip module in the chip module receptacle.

Exemplary embodiment 11 is a method in accordance with exemplary embodiment 10, wherein a release of the chip module from a larger assembly as final process for forming the chip module and the formation of the chip module receptacle in the carrier take place simultaneously.

Exemplary embodiment 12 is a method in accordance with exemplary embodiment 10 or 11, wherein the formation of the chip module receptacle in the carrier comprises a punching process.

Exemplary embodiment 13 is a method in accordance with exemplary embodiment 12, wherein a punching tool used for the punching process is used after the punching process for the releasable arrangement of the chip module in the chip module receptacle.

Exemplary embodiment 14 is a method in accordance with one of exemplary embodiments 10 to 13, wherein the formation of the chip module receptacle comprises a formation of a through-opening or a formation of a cavity.

Exemplary embodiment 15 is a method for using a chip arrangement in accordance with exemplary embodiment 1. The method comprises a removal of the chip module from the chip module receptacle and a reinsertion of the chip module into the chip module receptacle for contact-based and/or contactless use of the chip arrangement.

Exemplary embodiment 16 is a method in accordance with exemplary embodiment 15 which also comprises renewed removal of the chip module from the chip module receptacle and insertion of the chip module into a wearable for contactless use of the wearable.

Further advantageous configurations of the device can be gleaned from the description of the method, and vice versa.

The invention claimed is:

1. A chip arrangement, comprising:
a chip module, comprising:
a chip;
a contact-based interface in accordance with ISO 7816 which is electrically conductively connected to the chip; and
an antenna structure, which is electrically conductively connected to the chip and provides a contactless interface; and
a carrier, comprising:
a chip module receptacle; and
a booster antenna structure which, when the chip module is arranged in the chip module receptacle of the carrier, inductively couples to the antenna structure of the chip module,
wherein the chip module is arranged releasably in the chip module receptacle such that the chip module can be removed from the chip module receptacle and reinserted into the chip module receptacle repeatedly, and wherein the chip module, when removed from the chip module receptacle, is configured for contactless use via the antenna structure.

2. The chip arrangement as claimed in claim 1, wherein the chip module also comprises a chip module carrier.

3. The chip arrangement as claimed in claim 1, wherein the carrier comprises a carrier body in which the chip module receptacle is formed as an opening and on or in which the booster antenna structure is formed.

4. The chip arrangement as claimed in claim 3, wherein the carrier body and the chip module carrier comprise the same material or the same materials.

5. The chip arrangement as claimed in claim 4, wherein the chip module carrier is formed by being separated off from the carrier body.

6. The chip arrangement as claimed in claim 1, wherein the carrier has a smart card ID1 format.

7. The chip arrangement as claimed in claim 1, wherein the chip module receptacle is a through-opening.

8. The chip arrangement as claimed in claim 1, wherein the chip module receptacle is a cavity.

9. The chip arrangement as claimed in claim 1, wherein the chip module is connected in a form-fitting manner to the chip module receptacle.

10. A method for using a chip arrangement as claimed in claim 1, the method comprising:
removing the chip module from the chip module receptacle (820); and reinserting the chip module into the chip module receptacle for contact-based and/or contactless use of the chip arrangement (830).

11. The method as claimed in claim 10, also comprising:

renewed removing the chip module from the chip module receptacle; and inserting the chip module into a wearable for contactless use of the wearable.

12. A method for forming a chip arrangement, the method comprising:

forming a chip module that comprises a contact-based interface in accordance with ISO 7816 and which is electrically conductively connected to the chip, and an antenna structure that is electrically conductively connected to the chip;

forming a chip module receptacle in a carrier, wherein the carrier comprises a booster antenna structure which is designed to inductively couple to the antenna structure of the chip module when the chip module is arranged in the chip module receptacle; and releasably arranging the chip module in the chip module receptacle such that the chip module can be removed from the chip module receptacle and reinserted into the chip module receptacle repeatedly, wherein the chip module, when removed from the chip module receptacle, is configured for contactless use via the antenna structure.

13. The method as claimed in claim 12, wherein a release of the chip module from a larger assembly as final process for forming the chip module and the forming of the chip module receptacle in the carrier take place simultaneously.

14. The method as claimed in claim 12, wherein the forming the chip module receptacle in the carrier comprises a punching process.

15. The method as claimed in claim 14, wherein a punching tool used for the punching process is used after the punching process for the releasable arrangement of the chip module in the chip module receptacle.

16. The method as claimed in claim 12, wherein the forming the chip module receptacle comprises forming a through-opening or a formation of a cavity.

* * * * *